United States Patent
Matsuo et al.

(10) Patent No.: US 7,608,537 B2
(45) Date of Patent: Oct. 27, 2009

(54) METHOD FOR FABRICATING SEMICONDUCTOR DEVICE

(75) Inventors: Mie Matsuo, Kanagawa (JP); Hisashi Kaneko, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 86 days.

(21) Appl. No.: 11/861,087

(22) Filed: Sep. 25, 2007

(65) Prior Publication Data

US 2008/0081466 A1 Apr. 3, 2008

(30) Foreign Application Priority Data

Sep. 28, 2006 (JP) ............................. 2006-264186

(51) Int. Cl.
G03F 7/00 (2006.01)
H01J 49/42 (2006.01)
(52) U.S. Cl. ................ 438/672; 438/669; 257/E21.245
(58) Field of Classification Search .......... 257/E21.245, 257/E21.476; 438/669, 672, 401, 703, 694
See application file for complete search history.

(56) References Cited

U.S. PATENT DOCUMENTS

| | | | |
|---|---|---|---|
| 5,597,590 A | | 1/1997 | Tanimoto et al. |
| 6,377,232 B1 * | | 4/2002 | Chevet et al. ............... 345/63 |
| 6,462,428 B2 * | | 10/2002 | Iwamatsu ................... 257/797 |
| 6,528,386 B1 * | | 3/2003 | Summerfelt et al. ........ 438/401 |
| 2002/0139786 A1 * | | 10/2002 | Amako et al. .......... 219/121.76 |
| 2004/0043310 A1 * | | 3/2004 | Takeishi et al. .............. 430/22 |
| 2005/0064344 A1 * | | 3/2005 | Bailey et al. ................ 430/320 |
| 2005/0069815 A1 | | 3/2005 | Takeishi et al. |
| 2005/0070068 A1 * | | 3/2005 | Kobayashi .................. 438/401 |
| 2005/0106775 A1 * | | 5/2005 | Hasei .......................... 438/70 |
| 2007/0090549 A1 * | | 4/2007 | Kudo et al. ................. 257/797 |

FOREIGN PATENT DOCUMENTS

| | | | |
|---|---|---|---|
| JP | 10-226537 | * | 8/1998 |
| JP | 2001-15407 | | 1/2001 |
| JP | 2003-332215 | | 11/2003 |
| JP | 2005-59064 | | 3/2005 |

OTHER PUBLICATIONS

H. Shinomiya, et al., "Method for Manufacturing a Semiconductor Device", U.S. Appl. No. 11/790,723, filed Apr. 27, 2007.

* cited by examiner

*Primary Examiner*—Thomas L Dickey
*Assistant Examiner*—Nikolay Yushin
(74) *Attorney, Agent, or Firm*—Finnegan, Henderson, Farabow, Garrett & Dunner, L.L.P.

(57) ABSTRACT

A method for fabricating a semiconductor device, includes forming an opening in a first film, embedding an alignment mark material for alignment with an upper layer in the opening, forming a second film on the first film in which the alignment mark material is embedded, irradiating the second film formed in a predetermined region including a position where the alignment mark material is embedded with a processing light, thereby to remove the second film to an extent that a portion of the second film remains in the predetermined region, and exposing the portion of the second film remaining in the predetermined region to an etching environment for etching the second film.

20 Claims, 15 Drawing Sheets

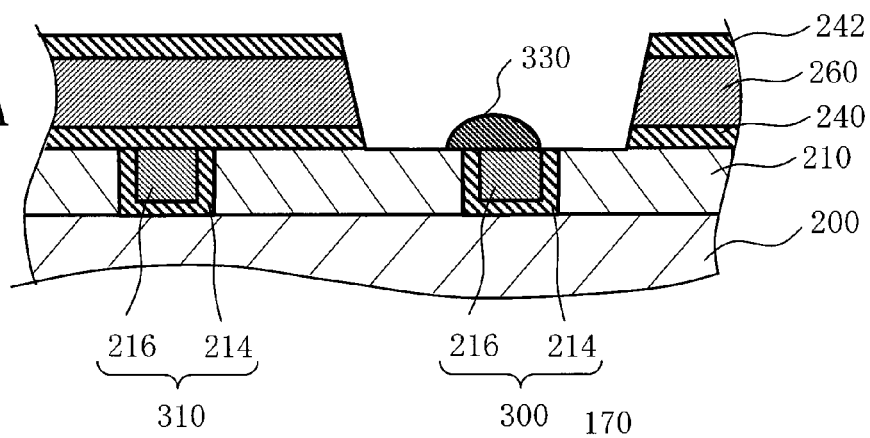
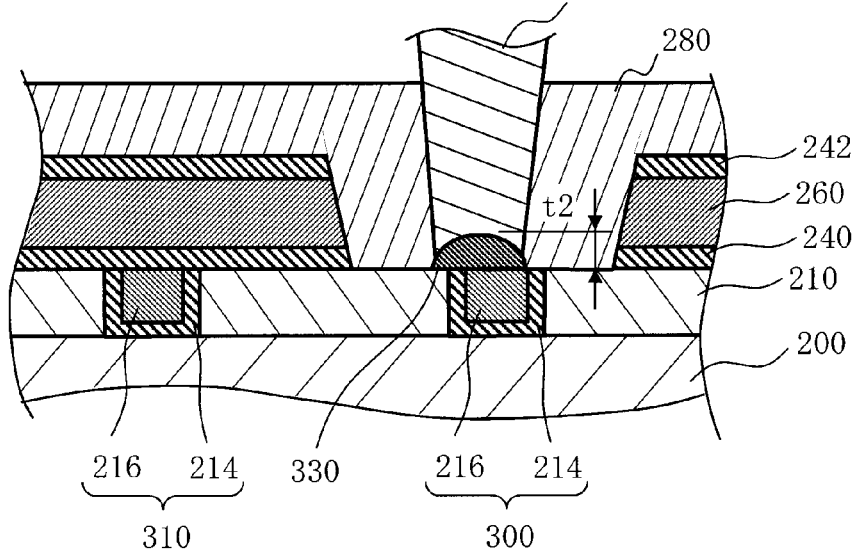
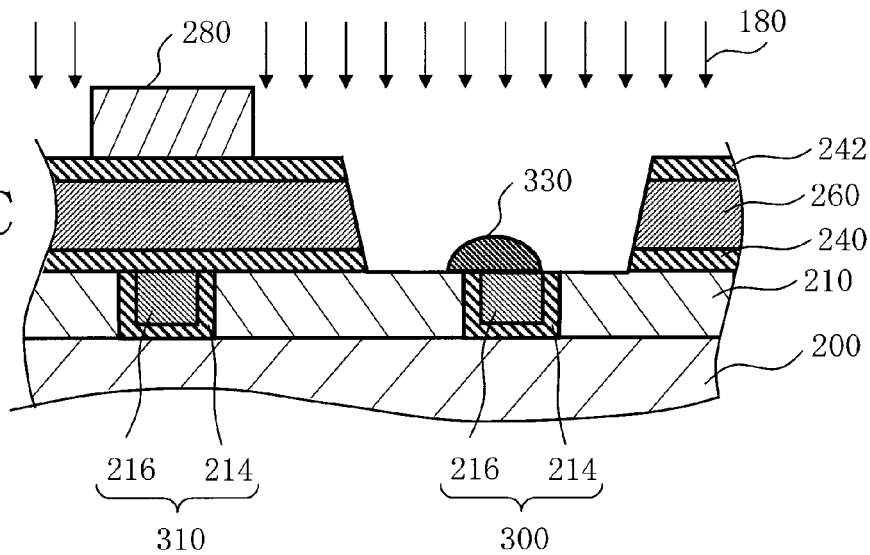

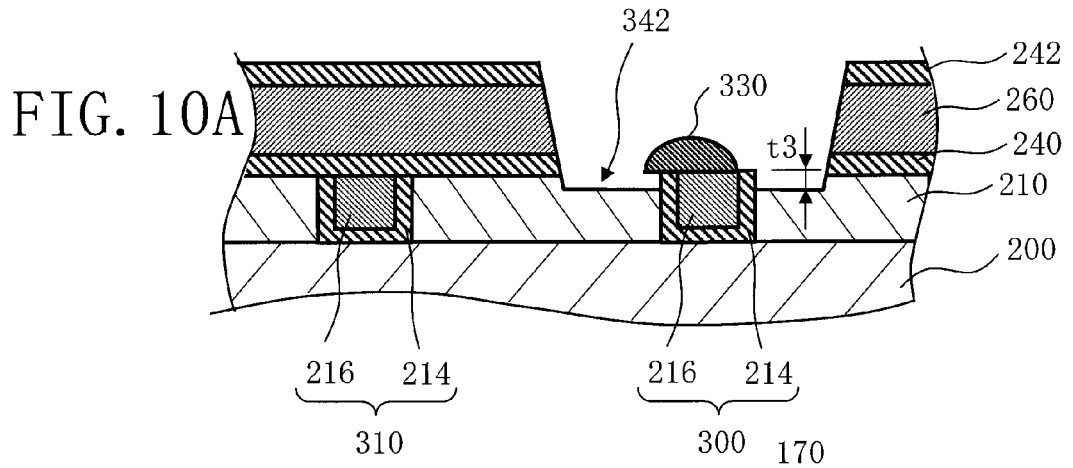
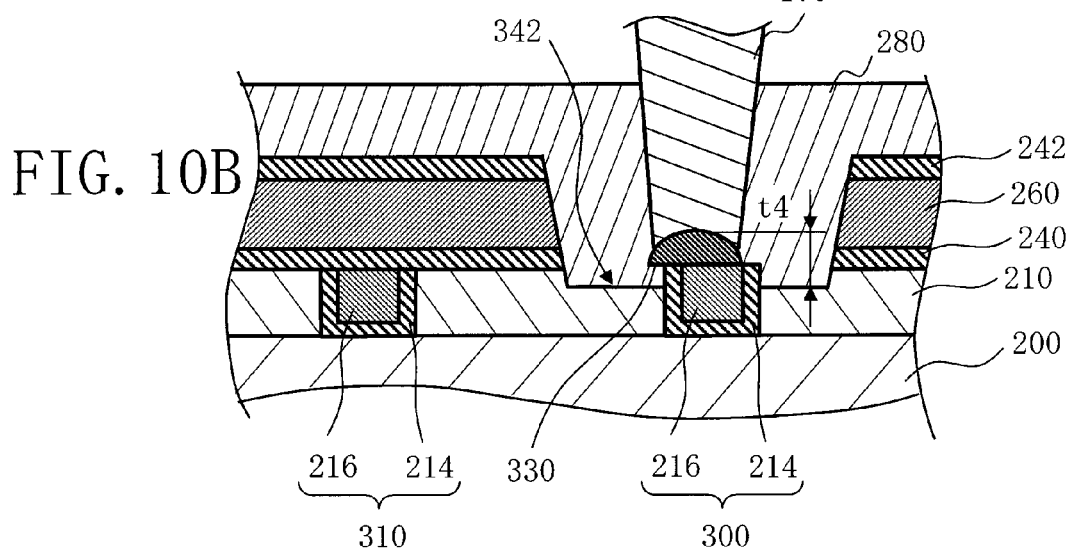
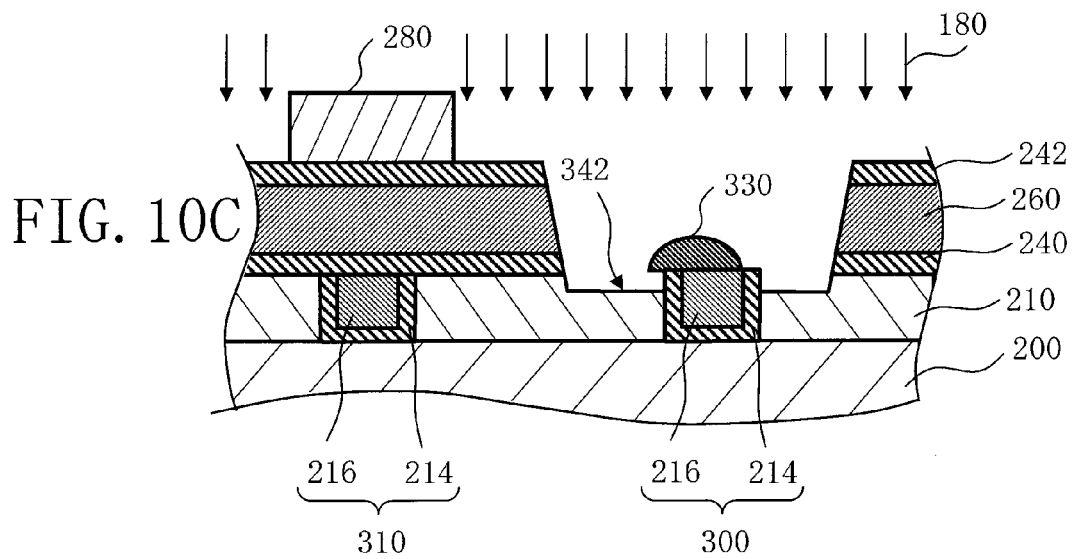

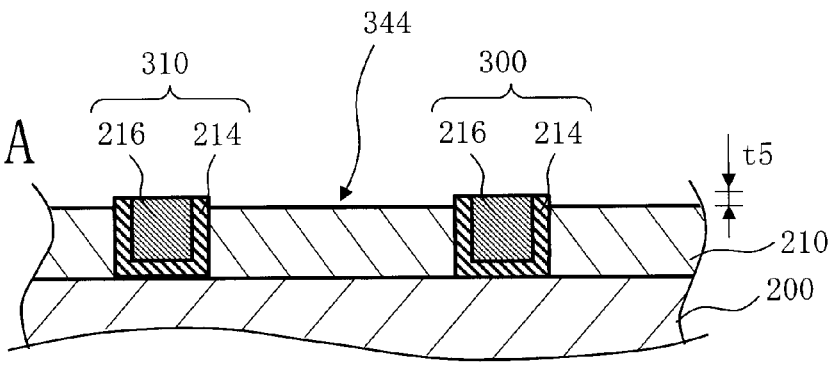
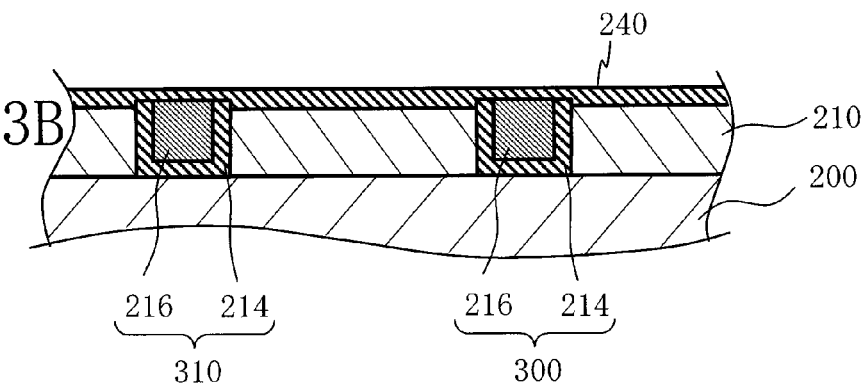
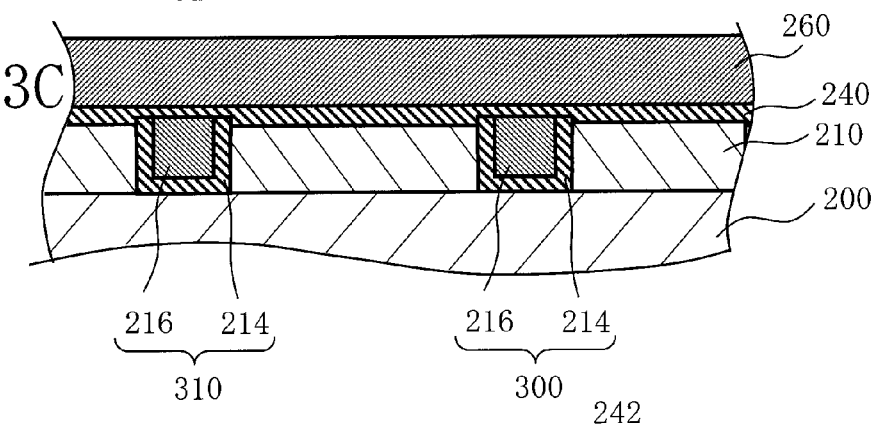
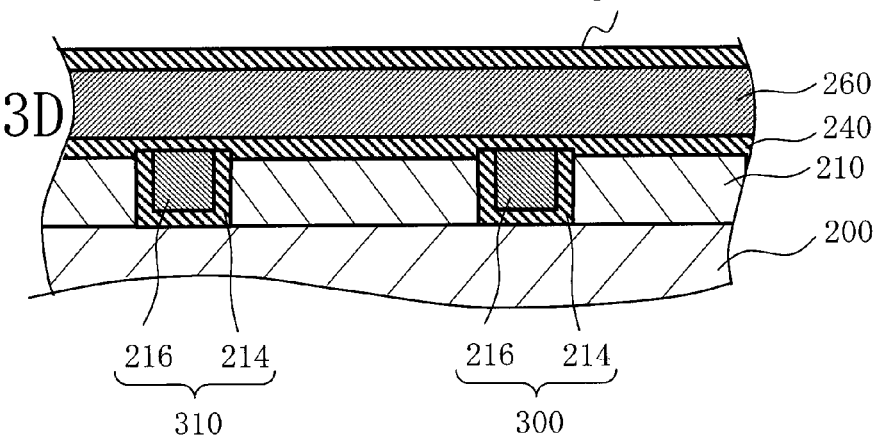

METHOD FOR FABRICATING SEMICONDUCTOR DEVICE

CROSS-REFERENCE TO RELATED APPLICATION

This application is based upon and claims the benefit of priority from the prior Japanese Patent Application No. 2006-264186 filed on Sep. 28, 2006 in Japan, the entire contents of which are incorporated herein by reference.

BACKGROUND OF THE INVENTION

1. Field of the Invention

The present invention relates to a method for fabricating a semiconductor device, and for example, a method for fabricating a semiconductor device, including a step of removing an opaque film formed on an alignment mark for alignment with an upper layer by ablation technology.

2. Related Art

As semiconductor devices have increasingly finer structures, higher precision of alignment technology with a lower layer is demanded in a lithography process among processes of manufacturing a semiconductor device. However, if a film formed in a resist lower layer reflects or absorbs a good portion of an alignment light, it is difficult to detect positional information from alignment marks. In a lithography process in which metallic wiring of, for example, aluminum (Al) is formed, there is a problem that the position of an alignment mark formed in a lower layer of an Al film cannot be directly detected because the Al film reflects or absorbs a good portion of the alignment light, that is, the Al film is opaque. Thus, an uneven form has conventionally been created at positions on an alignment mark on the surface of the Al film by providing a step height for the alignment mark itself in advance and subsequently forming the Al film. Then, by detecting an uneven form on the surface of the Al film, alignment has been performed. However, as the step height in the uneven form of an Al film created on an alignment mark becomes smaller with ever higher performance and precision of semiconductor devices, a problem of increasing alignment errors and decreasing lower yields has occurred.

Here, if detection sensitivity of an alignment mark should be enhanced, it is only necessary to remove an Al film on the alignment mark so that the alignment mark becomes visible. One method for this purpose is to add the lithography process for a region from which an Al film is to be removed, a dry etching process for the Al film, an asher process and the like. However, this method has a problem that the process becomes more complicated, resulting in increasing manufacturing costs, a longer manufacturing period, and increasing capital investment costs.

Thus, a method of selectively removing a film that is opaque with respect to an alignment light, such as an Al film, by ablation technology has been proposed as another method of removing an Al film on an alignment mark (see Published Unexamined Japanese Patent Application No. 2003-332215 (JP-A-2003-332215) and JP-A-2005-59064, for example). Ablation technology is one of processing technologies that use light such as a laser and enable microscopic patterns to be formed without using lithography technology, attracting attention in recent years as a processing technology of semiconductor devices. Ablation is a reaction in which a processed film melts or vaporizes if, when the processed film is irradiated with light, the intensity of irradiation reaches a certain threshold or more. Using this reaction, microscopic processing such as drilling and cutting can be performed. However, the wiring layer in a multilayer film tends to become thicker with ever higher performance, making processing by ablation more difficult without damaging areas around a processed film and a foundation thereof.

If, for example, an alignment mark is formed in a tungsten (W) embedded structure in a W plug layer and thereupon an Al film or a barrier metal film is formed as a wiring material, conventionally the Al film within a region around including the alignment mark and the barrier metal film in a lower layer of the Al film have all been removed using ablation technology. Here, if all films having a large reflectance like the Al film should be removed, it is necessary to increase laser energy of a laser to be a processing light or to apply a laser of a plurality of pulses. However, the threshold of ablation of silicon (Si) substrate and the W plug, whose reflectance is smaller, below the Al film is smaller than that of Al and it is difficult to remove the Al film only without damaging the W plug and substrate. As a result, the W plug to be a mark may also be removed together with the Al film. In such a situation, high-precision patterning cannot be performed because the alignment mark is removed. Further, a large amount of debris arises due to ablation, increasing debris in surrounding areas and causing a problem of dust.

BRIEF SUMMARY OF THE INVENTION

A method for fabricating a semiconductor device, according to an embodiment of the present invention, includes forming an opening in a first film, embedding an alignment mark material for alignment with an upper layer in the opening, forming a second film on the first film in which the alignment mark material is embedded, irradiating the second film formed in a predetermined region including a position where the alignment mark material is embedded with a processing light, thereby to remove the second film to an extent that a portion of the second film remains in the predetermined region, and exposing the portion of the second film remaining in the predetermined region to an etching environment for etching the second film.

A method for fabricating a semiconductor device, according to another embodiment of the present invention, includes forming a plurality of openings in a first film, embedding a metallic material serving as both a contact plug material and an alignment mark material for alignment with an upper layer in the plurality of openings, forming a second film on the first film in which the metallic material is embedded, irradiating the second film formed in a predetermined region including a position where the metallic material is embedded as the alignment mark material with a processing light, thereby to remove the second film to an extent that a portion of the second film remains in the predetermined region, and etching the portion of the second film remaining in the predetermined region.

BRIEF DESCRIPTION OF THE DRAWINGS

FIGS. 8A to 8C are step sectional views representing steps performed corresponding to the flow chart in FIG. 1;

FIGS. 10A to 10C are step sectional views representing processes in a second embodiment performed corresponding to the flow chart in FIG. 1;

FIGS. 13A to 13D are step sectional views representing steps performed corresponding to the flow chart in FIG. 12;

DETAILED DESCRIPTION OF THE INVENTION

First Embodiment

A first embodiment will be described below with reference to FIG. 1.

Figure 1:
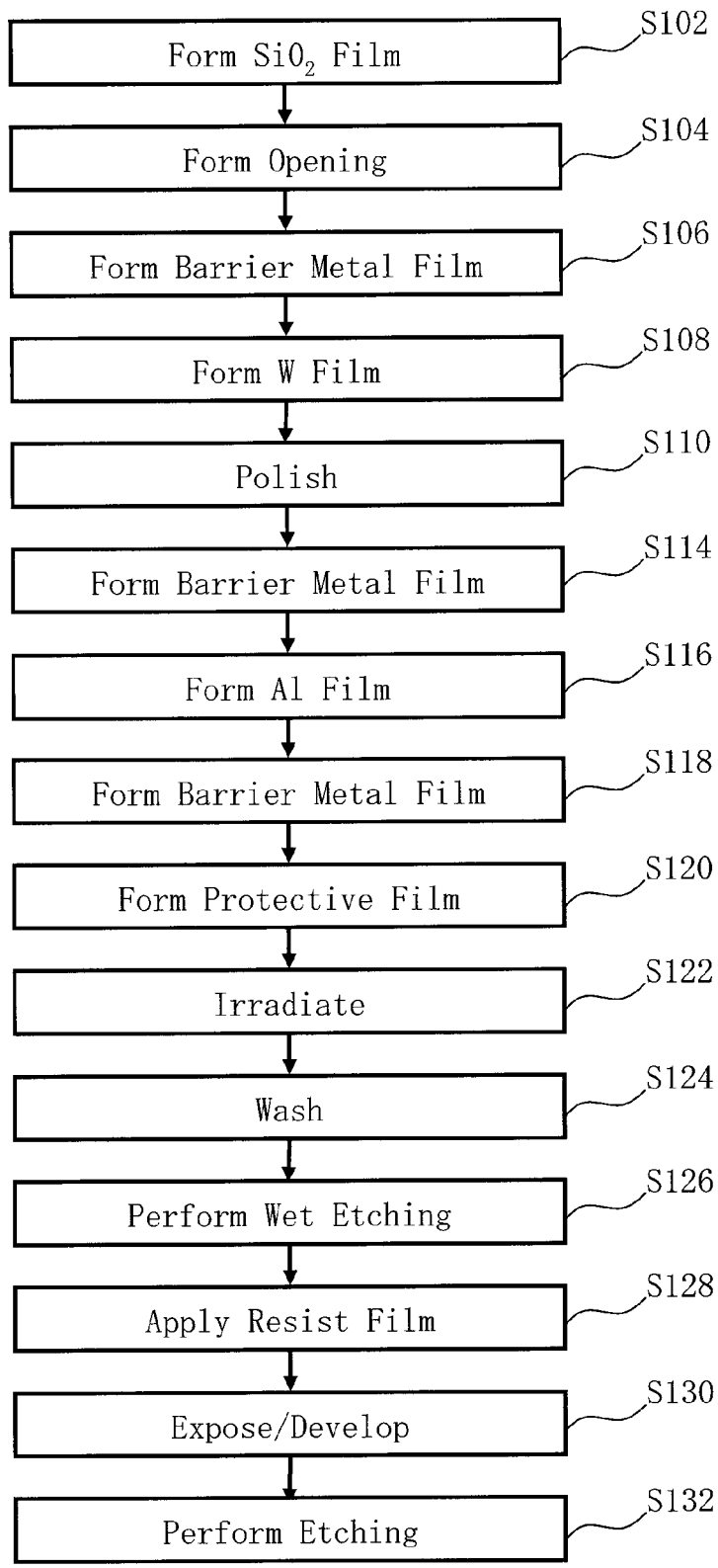
FIG. 1 is a flow chart showing principal parts of a method of manufacturing a semiconductor device in a first embodiment.

FIG. 1 is a flow chart showing principal parts of a method of manufacturing a semiconductor device in the first embodiment. A series of steps shown in FIG. 1 are performed in the present embodiment, including an $SiO_2$ film formation step (S102) to form a thin film of a $SiO_2$ film, an opening formation step (S104) to form an opening, a barrier metal film formation step (S106), a W film formation step (S108) to form a thin film of a tungsten (W) film, a polishing step (S110), a barrier metal film formation step (S114), an Al film formation step (S116) to form a thin film of an aluminum (Al) film, a barrier metal film formation step (S118), a protective film formation step (S120) to form a protective film, an irradiation step (S122), a washing step (S124), a wet etching step (S126), a resist film application step (S128), an exposure/development step (S130), and an etching step (S132).

FIGS. 2A to 2D are step sectional views representing steps performed corresponding to the flow chart in FIG. 1. FIGS. 2A to 2D show the $SiO_2$ film formation step (S102) to the W film formation step (S108) in FIG. 1. The subsequent steps will be described later.

Figure 2A:
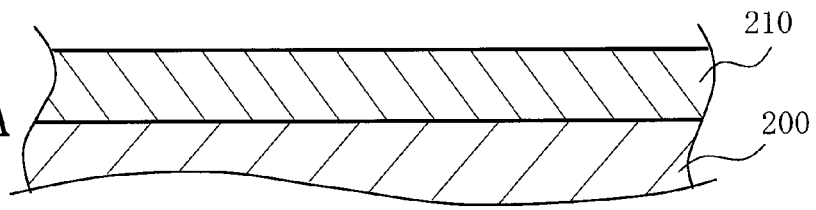
FIGS. 2A to 2D are step sectional views representing steps performed corresponding to the flow chart in FIG. 1.

In FIG. 2A, as the $SiO_2$ film formation step, a thin film of a $SiO_2$ film with a thickness of 500 nm is deposited on the surface of a substrate 200 to be a semiconductor substrate by a chemical vapor deposition (CVD) method to form an $SiO_2$ film 210 (first film) to be a dielectric film. Here, the CVD method is used for film formation, but any other method may also be used. Also, a silicon wafer of 300 millimeter in diameter, for example, is used as the substrate 200. Here, an illustration of a device portion is omitted. Then, a layer having various semiconductor elements or structures (not shown) such as metallic wiring and a contact plug may be formed on the substrate 200. Or, other layers may be formed.

Figure 2B:
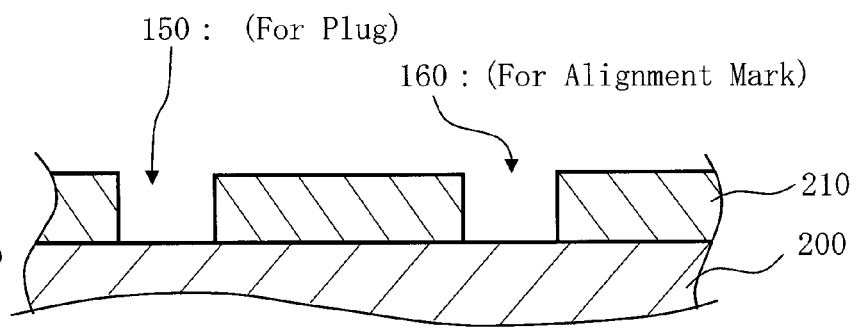

In FIG. 2B, as the opening formation step, an opening 150, which is a plug hole structure for preparing a plug in the lithography process and the dry etching process, and an opening 160, which is a mark hole structure for creating an alignment mark for performing alignment with an upper layer, are formed inside the $SiO_2$ film 210. The opening 150 and the opening 160 may be formed by removing the exposed $SiO_2$ film 210 by an anisotropic etching method on the substrate 200 having the $SiO_2$ film 210 on which a resist film is formed through the lithography process such as the resist application process and exposure process (not shown). By using the anisotropic etching method, the opening 150 and the opening 160 can be formed approximately vertically with respect to the surface of the substrate 200. For example, the opening 150 and the opening 160 may be formed by a reactive ion etching process.

Figure 2C:
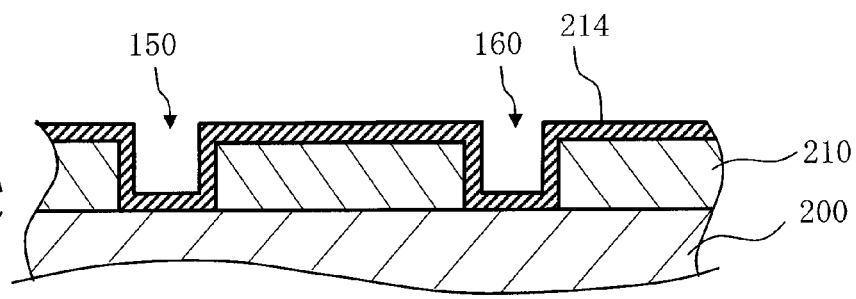

In FIG. 2C, as the barrier metal film formation step to be an example of embedding step, a titanium nitride (TiN) film 214 to be a barrier metal film using a barrier metal material is formed in the opening 150 and the opening 160 formed by the above opening formation step and on the surface of the $SiO_2$ film 210. A thin film of the TiN film 214 is formed in a sputtering apparatus using a sputtering method, which is one of (physical vapor deposition (PVD) methods. The method of depositing the barrier metal material is not limited to the PVD method, anatomic layer deposition (ALD) method, an atomic layer chemical vapor deposition (ALCVD) method, and the CVD method can be used. A better coverage factor can be obtained than when the PVD method is used. In addition to TiN, the material of the barrier metal film may be tantalum (Ta), tantalum nitride (TaN), titanium (Ti), or a laminated film combining Ta, TaN and the like.

Figure 2D:
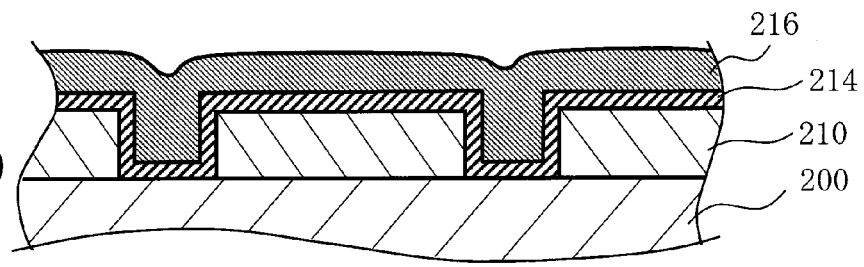

In FIG. 2D, as the W film formation step to be an example of embedding step, a thin film of a W film 216 by W to be an alignment mark material and plug material is deposited (formed) on an inner wall of the opening 150, that of the opening 160, and the surface of the $SiO_2$ film 210 where the TiN film 214 has been formed by the CVD method.

FIGS. 3A to 3D are step sectional views representing steps performed corresponding to the flow chart in FIG. 1. FIGS. 3A to 3D show the polishing step (S110) to the barrier metal film formation step (S118) in FIG. 1. The subsequent steps will be described later.

Figure 3A:
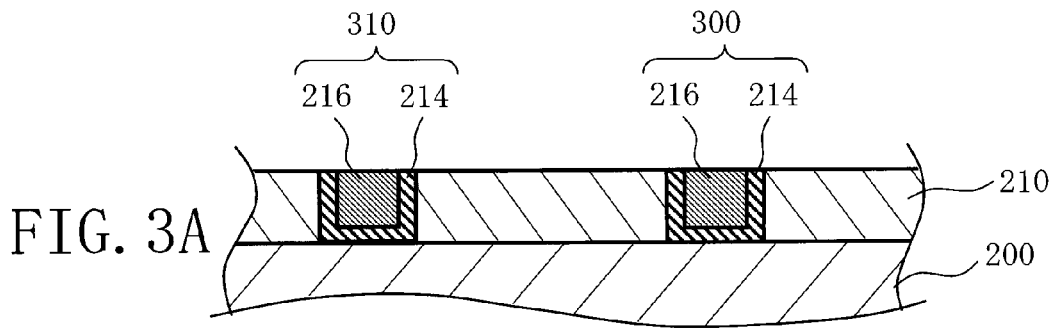
FIGS. 3A to 3D are step sectional views representing steps performed corresponding to the flow chart in FIG. 1.

In FIG. 3A, as the polishing step, the surface of the substrate 200 is polished by a chemical-mechanical polishing (CMP) method to remove the W film 216 and the TiN film 214 deposited on the surface of the $SiO_2$ film 210 excluding the opening 150 and the opening 160 by polishing for planarization, whereby an alignment mark 300 and a W plug 310 of the embedded structure are formed in the W plug layer shown in FIG. 3A.

Figure 3B:
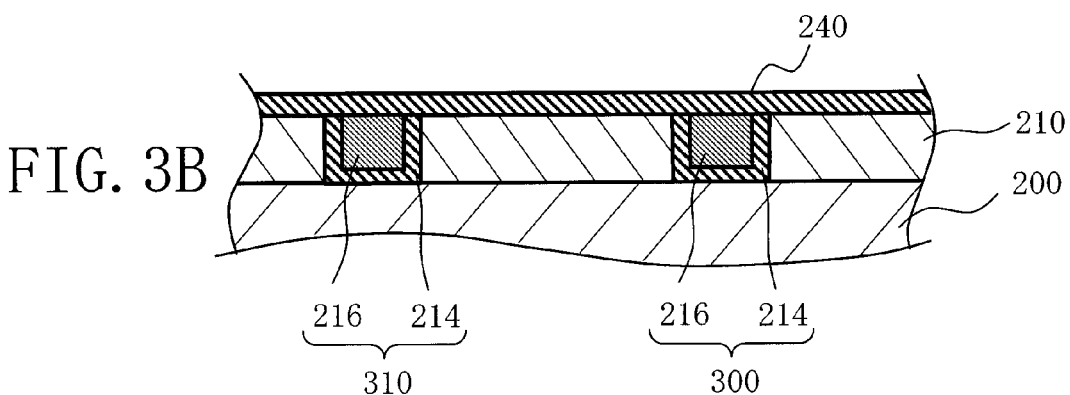

In FIG. 3B, as the barrier metal film formation step, a barrier metal film 240 using a barrier metal material is formed on the surface of the $SiO_2$ film 210 planarized by the polishing step and that of the W film 216 and the TiN film 214 deposited in the openings 150 and 160. TiN is here used as the material of the barrier metal film. In addition to TiN, Ta, TaN, Ti, a laminated film combining Ta, TaN and the like may also be used. Also, not only the PVD method, but also the ALD method, ALCVD method, and CVD method may be used as the formation method.

Figure 3C:
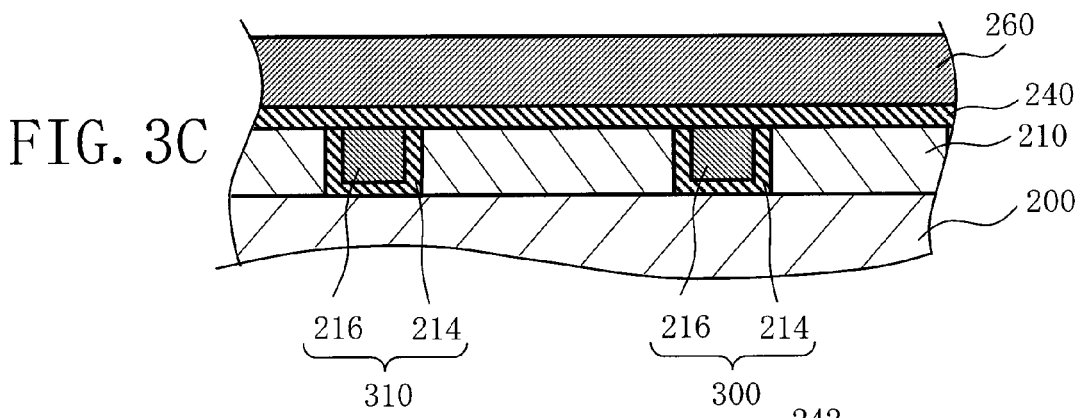

In FIG. 3C, as the Al film formation step, an Al film 260 (an example of a second film) to be upper-layer wiring of the W plug 310 is formed on the barrier metal film 240. The sputtering method, the CVD method or the like may be used as the formation method.

Figure 3D:
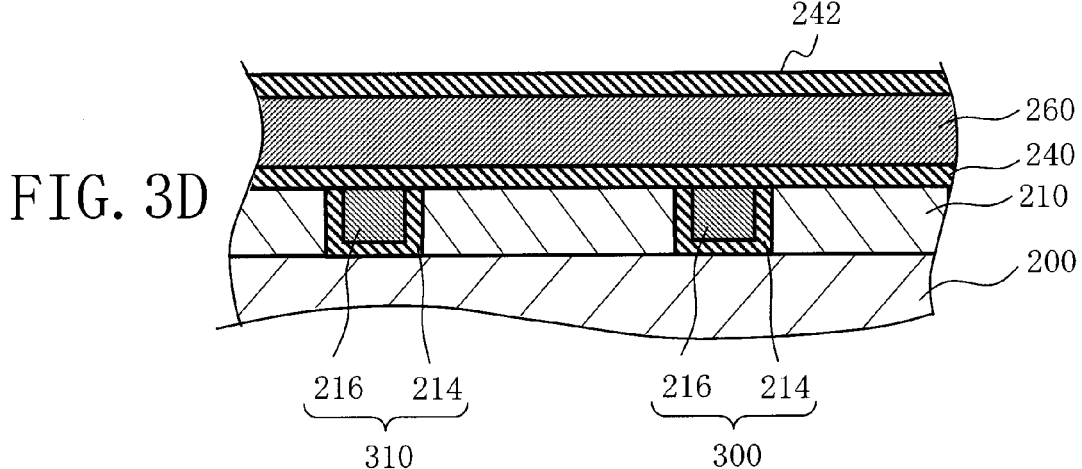

In FIG. 3D, as the barrier metal film formation step, a barrier metal film 242 using a barrier metal material is formed on the surface of the Al film 260. TiN is here used as the material of the barrier metal film. In addition to TiN, Ta, TaN, Ti, a laminated film combining Ta, TaN and the like may also be used. Also, in addition to the PVD method, the ALD method, ALCVD method, or CVD method may be used as the formation method.

A laminated film (an example of the second film) of metal films of such wiring materials is formed. Since such metal films are opaque films, and thus if unchanged, it becomes difficult to detect the position of the alignment mark 300 for alignment with the lower-layer W plug 310 when the Al wiring is patterned. Consequently, if unchanged, high-precision patterning cannot be performed.

Figure 4A:
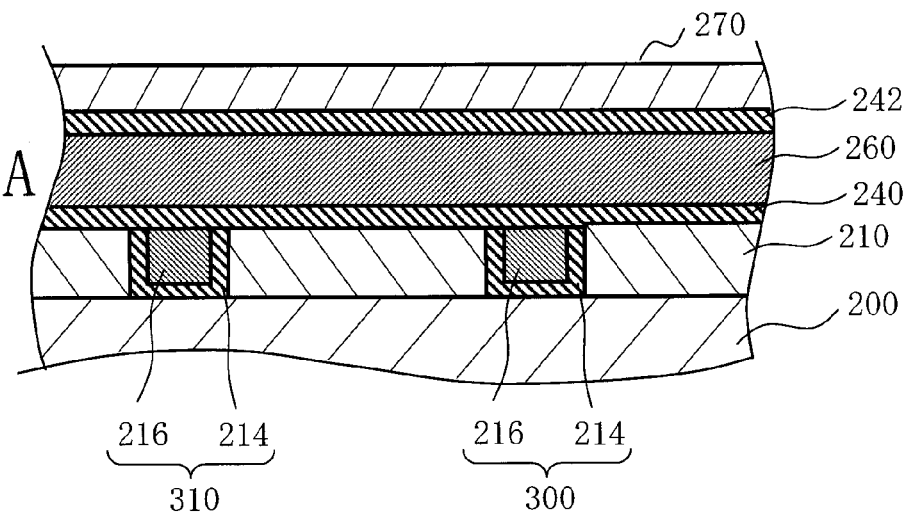
FIGS. 4A to 4C are step sectional views representing steps performed corresponding to the flow chart in FIG. 1.
Figure 4B:
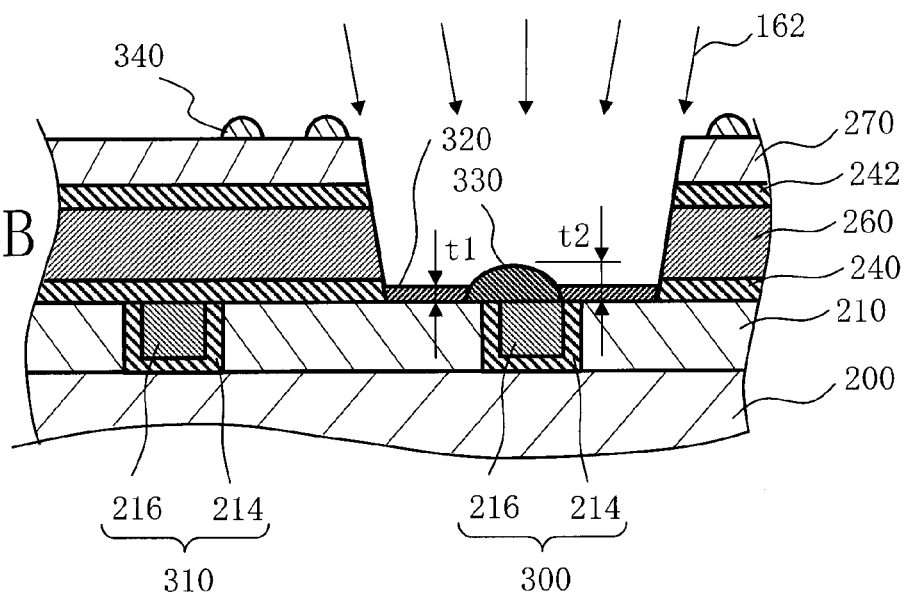
Figure 4C:
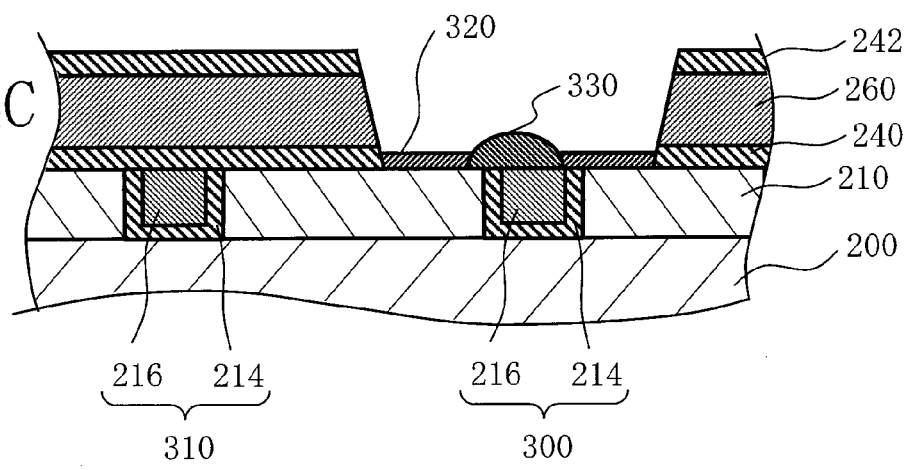

FIGS. 4A to 4C are step sectional views representing steps performed corresponding to the flow chart in FIG. 1. FIGS. 4A to 4C show the protective film formation step (S120) to the washing step (S124) in FIG. 1. The subsequent steps will be described later.

In FIG. 4A, as the protective film formation step, an aqueous protective film 270 is formed on the surface of the barrier metal film 242. Forming the aqueous protective film 270 makes it possible to suppress a defect occurrence caused by debris 340 shown in FIG. 4B caused in the irradiation step (ablation) described later being attached to the surface of substrate. An organic film containing polyacrylic acid, for example, can be used as the aqueous protective film 270. As another necessary condition for the protective film 270, a material that absorbs only a small amount of wavelengths of light irradiated in the irradiation step described later and reacts little with the foundation is desirable. Example of such a material include organic materials having a hydrophilic group such as a hydroxyl group, a carboxyl group, and an amino group, and an aqueous inorganic material. The protective film 270 may be formed, for example, by applying the above organic film to the surface of the barrier metal film 242 by a rotating application method and then volatilizing the solvent. Using the aqueous protective film 270 makes subsequent removal of the protective film easier compared with a case in which a heat-resistant organic material such as polyimide and polyamide is used.

In FIG. 4B, as the irradiation step to be an example of removal step, the laminated film containing Al is removed by irradiating a region including the alignment mark 300 with a processing light 162 using ablation technology. That is, the Al film 260 and the barrier metal films 240 and 242 formed in a predetermined region including the position of the alignment mark 300 where W to be an alignment mark material is embedded are irradiated with the processing light 162 from above the protective film 270. Thereby, the laminated film of the Al film 260 and the barrier metal films 240 and 242 is removed to such an extent that a residual film 320, which is a portion of the Al film 260 and the barrier metal films 240 and 242, remains in the predetermined region. At this point, the protective film 270 in the irradiation region is also removed. The residual film 320 may be formed, for example, to have a thickness of 10 nm or less.

Figure 5:
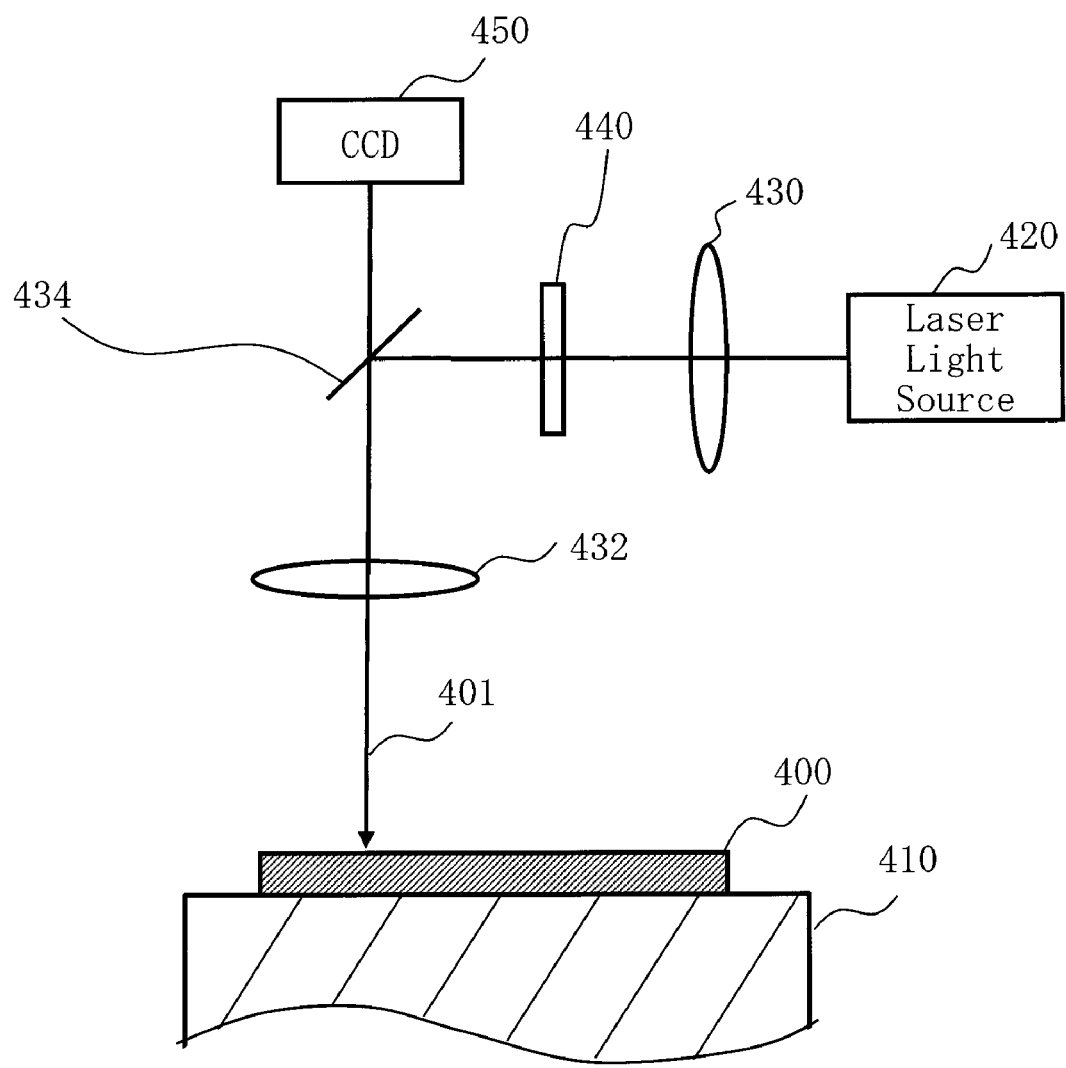
FIG. 5 is a conceptual diagram exemplifying a configuration of an ablation apparatus in the first embodiment.

FIG. 5 is a conceptual diagram exemplifying a configuration of an ablation apparatus in the first embodiment. In FIG. 5, a laser light 401 to become the processing light 162 shown in FIG. 4B after being irradiated from a laser light source 420 is applied to a slit 440 through an optical system 430. By passing though the slit 440 (also called an aperture), waveforms of the laser light 401 are formed to fit into an irradiation region on a substrate 400. Then, the formed laser light 401 is applied to a desired irradiation region of the substrate 400 on a movable stage 410 via a half mirror 434 and an optical system 432. Also, the irradiation position can be controlled by adjusting the optical axis through movement of the stage 410 via the half mirror 434 from an observational system such as a CCD camera 450.

A laser with a wavelength of 355 nm, which is three times harmonics of the YAG laser, was used as the laser light 401 to become the processing light 162. The laser wavelength is not limited to this wavelength. For example, lasers of the wavelength in the ultraviolet region of 500 nm or less such as four times harmonics (wavelength: 266 nm) of the YAG laser, a KrF excimer laser, and an ArF excimer laser can suitably be used. Also in the present embodiment, 5 nsec was used as the pulse width of the laser light 401 to emit a shot of laser light of the irradiation energy density of 1.5 J/cm$^2$. A shot of laser light is desirable in the present embodiment in order to leave the residual film 320 intact as if to leave a thin film in a predetermined range region on the surface of the SiO$_2$ film 210 including the upper surface of the alignment mark 300. However, the energy density, pulse width, number of pulses, cycle frequency and the like are not limited to values described above and may suitably be selected depending on material to be removed and foundation material.

Figure 6:
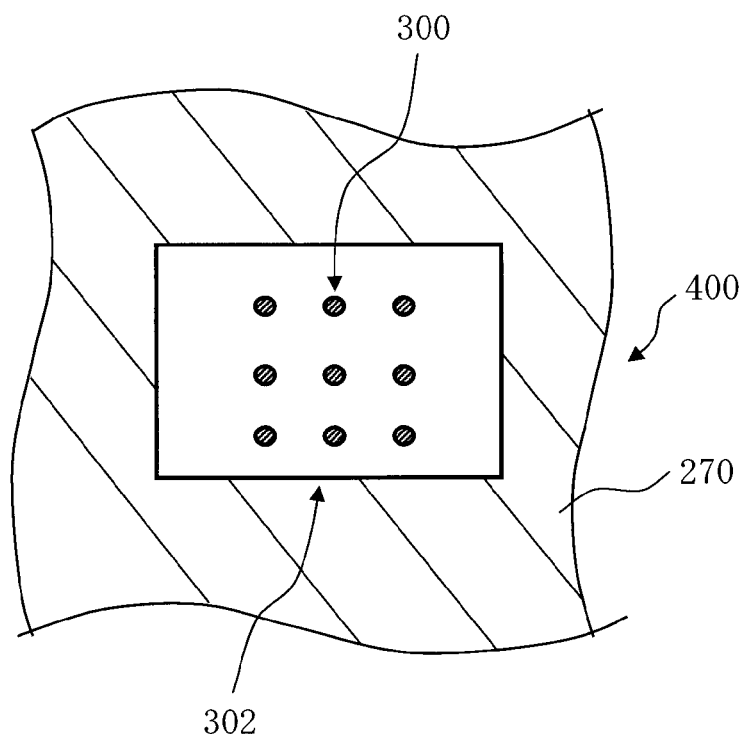
FIG. 6 is a diagram exemplifying alignment mark positions in the first embodiment.

FIG. 6 is a diagram exemplifying alignment mark positions in the first embodiment. As shown in FIG. 6, a plurality of alignment marks 300 are usually formed, instead of one. Thus, a predetermined region including arrangement positions of the plurality of alignment marks 300, that is, a region whose size is larger than a region in which marks are formed is irradiated as an irradiation region 302 with the processing light 162. Therefore, it is desirable to make laser intensity in the region have a substantial top hat waveform in the processing region, for example, a top hat waveform within 10%. The processing light 162 is formed by the above slit 440 to fit to the irradiation region 302.

Figure 7:
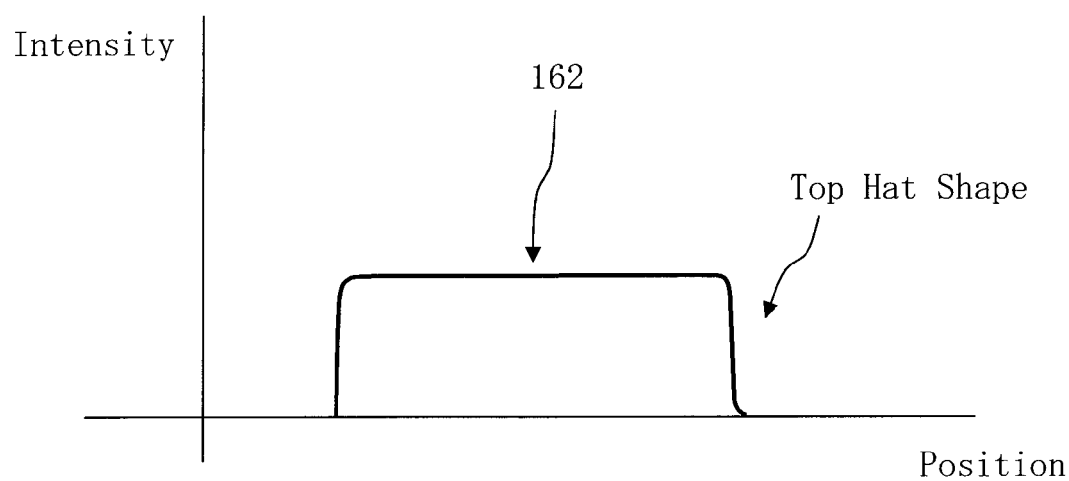
FIG. 7 is a diagram exemplifying an intensity distribution of a processing light in the first embodiment.

FIG. 7 is a diagram exemplifying an intensity distribution of processing light in the first embodiment. The intensity distribution of light irradiated via an optical system is usually different in intensity from position to position like the Gaussian distribution. If the distribution is unchanged, the high-precision alignment mark 300 cannot be obtained because an ablation effect within the irradiation region 302 will not be uniform. Thus, by forming the processing light 162 by the slit 440 while the irradiation distribution is broadened whose intensity is substantially made uniform to obtain a top hat waveform, the ablation effect can be substantially made uniform within the irradiation region 302. Here, for example, the top hat waveform of 10% is set by assuming that precision of permissible variation of the film is 10%, the waveform may suitably be adjusted in accordance with precision of permissible variation of the film.

With irradiation of the processing light 162 as described above, the metal laminated film (TiN film 240/Al film 260/TiN film 242) is ablated together with the protective film 270 within the irradiation region 302. At this point, in contrast to the prior art, as described above, at least one of metals, which are materials to be ablated, Ti and Al in the present embodiment, are caused to be left on the alignment mark 300 of the foundation W and the SiO$_2$ film 210 to become a dielectric film. As a result, the residual film 320, which is a porous film after Al and Ti being melted, is left on the SiO$_2$ film 210 and a residual film 330, which is a residue in a shape having an approximate sphere or in an approximately spherical shape after Al and Ti that had not be ablated being melted, is left on the foundation metal W, which is the alignment mark material.

Here, as long as irradiation of the processing light 162 to W is blocked by the residual films 320 and 330, W is harder to melt than Al and TiN during ablation and also heat added to the laminated film material such as Al can be released to the outside via W, since W has a higher melting point than Al and TiN to be ablated. Thus, the residual film 330 having an approximate sphere with a thickness t2, which is thicker than a thickness t1 of the residual film 320 left on the $SiO_2$ film 210, can be formed on W. In other words, when removing the laminated film including the Al film 260 by irradiation of the processing light 162, the laminated film is removed in such a way that the thickness t1 of the residual film 320 left in the irradiation region 302 becomes thinner than the thickness t2 of the residual film 330 remaining on the alignment mark 300. For example, while the thickness t1 of the residual film 320 has a value equal to 10 nm or less, the thickness t2 of the residual film 330 is about 100 nm. Then, this residual film 330 can prevent the alignment mark 300 from coming off due to ablation. Further, ablation is performed in such a way that the residual film 320 is left on the $SiO_2$ film 210, whereby it is possible to reduce the amount of the debris 340 flying off to surrounding areas compared with a case in which all metal laminated films (TiN film 240/Al film 260/TiN film 242) are removed.

In FIG. 4C, as the washing step, the aqueous protective film 270 is removed by washing. The debris 340 outside the irradiation region that has flown off due to ablation can be removed together during washing. Using the aqueous protective film 270 makes removal of the protective film easier compared with a case in which a heat-resistant organic material such as polyimide and polyamide is used.

FIGS. 8A to 8C are step sectional views representing steps performed corresponding to the flow chart in FIG. 1. FIGS. 8A to 8C show the wet etching step (S126) to the exposure/development step (S130) in FIG. 1. The subsequent steps will be described later.

In FIG. 8A, as the wet etching step to be an example of etching step, the residual film 320 is etched by exposing the residual film 320 remaining in the irradiation region to an etching environment for etching residues of the laminated film including the Al film 260. Here, the substrate surface is brought into contact with an etchant of organic acid containing sulfuric acid to wet-etch the residual film 320. In the above irradiation step (ablation step), when removing the laminated film including the Al film 260 by irradiation of the processing light 162, the laminated film has been removed in such a way that the thickness t1 of the residual film 320 left in the rest irradiation region becomes thinner than the thickness t2 of the residual film 330 remaining on the alignment mark 300. Since the residual film 320 is solidified after temporarily dissolving the TiN film 240/Al film 260/TiN film 242, the residual film 320 has many pores and a low density, making etching easier. Thus, the residual film 320 on the $SiO_2$ film 210 can be removed by etching while leaving the residual film 330 on W. For example, the residual film 320 may be soaked in an etchant for one minute. Examples of the etchant include the EKC270 series (manufactured by EKC Technology), EKC600 series (manufactured by EKC Technology), and PRX-200 series (manufactured by Shipley).

In FIG. 8B, as the resist application step, a resist is applied to the substrate surface to form a resist film 280. An i-ray resist film, for example, is used as the resist film 280. However, the resist film is not limited to this, and for example, the KrF resist, ArF resist, EB (electron beam) resist are also suitable. Then, the position of the alignment mark 300 of W is optically detected by an alignment light 170 thereby to perform alignment for patterning of Al wiring to be an upper layer of the W plug 310 by use of the detected position of the alignment mark 300 as an index mark.

In FIG. 8C, as the exposure/development step, a resist pattern is formed by selectively irradiating the resist film 280 with an exposure light 180 to perform development processing.

Figure 9:
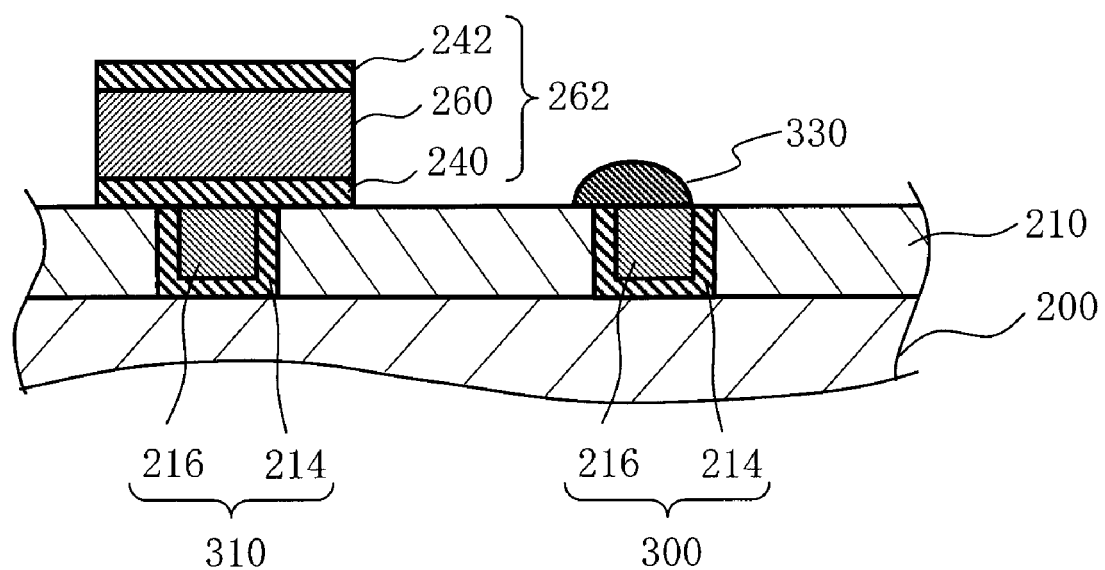
FIG. 9 is a step sectional view representing a process performed corresponding to the flow chart in FIG. 1.

FIG. 9 is a step sectional view representing a step performed corresponding to the flow chart in FIG. 1. FIG. 9 shows the etching step (S132) in FIG. 1.

In FIG. 9, as the etching step, wiring 262 of Al is formed by selectively etching the laminated film including the Al film 260, as shown in FIG. 9, using the resist pattern formed by the above lithography process as a mask. Subsequently, processing such as ashing is performed to remove the resist pattern.

In the present embodiment, as described above, the residual film 320 and the residual film 330, which are ablated products, are caused to remain in the irradiation region on the surface of the $SiO_2$ film 210 including the alignment mark 300 by suitably selecting conditions of energy and the like during laser ablation, followed by performing etching. Consequently, the alignment mark 300 can be laid bare from opaque films and the like while protecting it. Thus, the alignment mark 300 can be prevented from coming off. In other words, it is possible to prevent the alignment mark material from being removed together with opaque films and the like during irradiation of the processing light. If ablation is performed under under-etching conditions, a large amount of metal that melted, but did not vaporize remains as the residual film 330 on the metal (here W) below in a spherical shape that is convex upward. As a result, signal strength is increased when alignment is performed, improving viewability. Therefore, a high-precision alignment mark can be obtained.

Second Embodiment

In order to further improve alignment precision in comparison with the first embodiment, the following method is also suitable. A method of manufacturing a semiconductor device to improve alignment precision will be described below. In a second embodiment, each step is the same as that in the first embodiment except the wet etching step (S126).

The $SiO_2$ film formation step (S102) to the washing step (S124) are the same as those in the first embodiment and therefore, descriptions thereof are omitted.

FIGS. 10A to 10C are step sectional views representing steps in the second embodiment performed corresponding to the flow chart in FIG. 1. FIGS. 10A to 10C show the wet etching step (S126) to the exposure step (S130) in FIG. 1. The subsequent steps will be described later.

In FIG. 10A, as the wet etching step to be an example of etching step, the residual film 320 is etched by exposing the residual film 320 remaining in the irradiation region to an etching environment for etching residues of the laminated film including the Al film 260. Here, an upper part of the foundation $SiO_2$ film 210 is also etched when performing wet etching of the residual film 320 by causing the etchant in the first embodiment to contain a small amount of fluoric acid. A recess 342 is formed by digging down to a depth t3 in the foundation $SiO_2$ film 210 when etching the residual film 320 of the laminated film including the Al film, as described above. Thereby, the surface of the $SiO_2$ film 210 is etched so that the upper part of the alignment mark material protrudes from the surrounding area in the irradiation region. The depth t3 of the recess 342 can be processed to an extent that the alignment mark 300 does not fall by digging down too much.

Then, as the resist application step shown in FIG. 10B, the resist film 280 is formed by applying a resist to the substrate surface. When the position of the alignment mark 300 of W is optically detected by the alignment light 170, the alignment mark 300 protrudes upward in a convex fashion by a height t4, which is higher than in the first embodiment, from the surface of the SiO₂ film 210, so that the added height can still increase the signal strength. Therefore, alignment can be performed more easily.

Then, as the exposure/development step shown in FIG. 10C, a resist pattern is formed by selectively irradiating the resist film 280 with the exposure light 180 to perform development processing.

Figure 11:
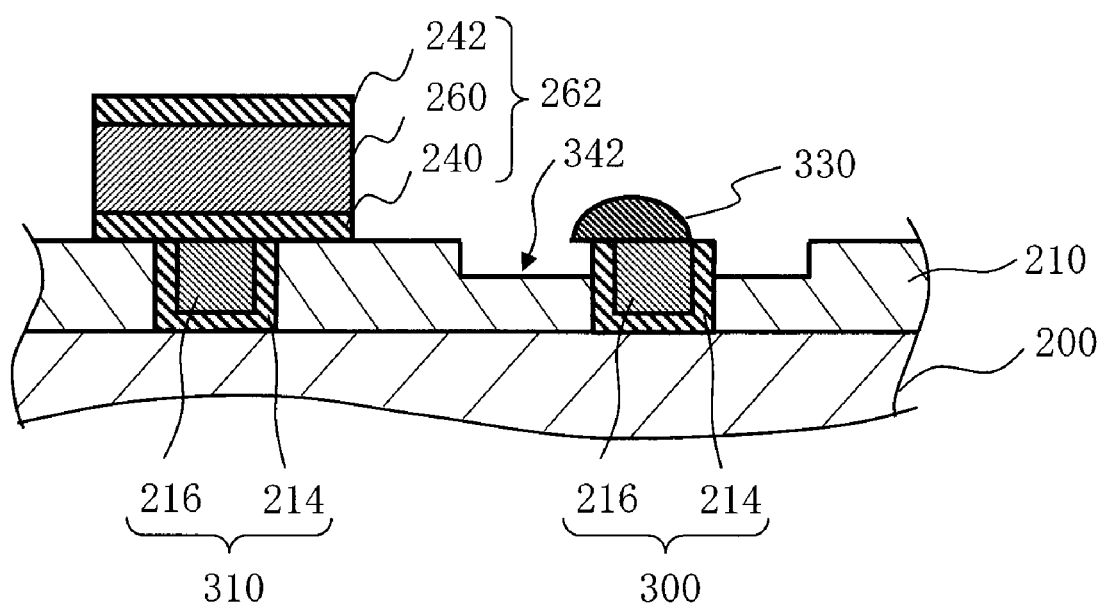
FIG. 11 is a step sectional view representing a process in the second embodiment performed corresponding to the flow chart in FIG. 1.

FIG. 11 is a step sectional view representing a step in the second embodiment performed corresponding to the flow chart in FIG. 1. FIG. 11 shows the etching step (S132) in FIG. 1. As the etching step, the wiring 262 of Al is formed by selectively etching the laminated film including the Al film 260, as shown in FIG. 11, by use of the resist pattern formed by the above lithography process as a mask. Subsequently, processing such as ashing is performed to remove the resist pattern.

As described above, the alignment mark 300 is formed in such a way that the alignment mark 300 protrudes upward in a convex fashion still higher from the surface of the SiO₂ film 210 in the surrounding area in comparison with the first embodiment, whereby high-precision alignment can be obtained.

Third Embodiment

In the second embodiment, etching of the residual film 320 is performed after the irradiation step (ablation) in such a way that the alignment mark 300 protrudes upward in a convex fashion still higher from the surface of the SiO₂ film 210 in the surrounding area. In a third embodiment, description will be given to a case in which additional etching is performed before the irradiation step (ablation) in such a way that the alignment mark 300 protrudes upward in a convex fashion still higher from the surface of the SiO₂ film 210 in the surrounding area.

Figure 12:
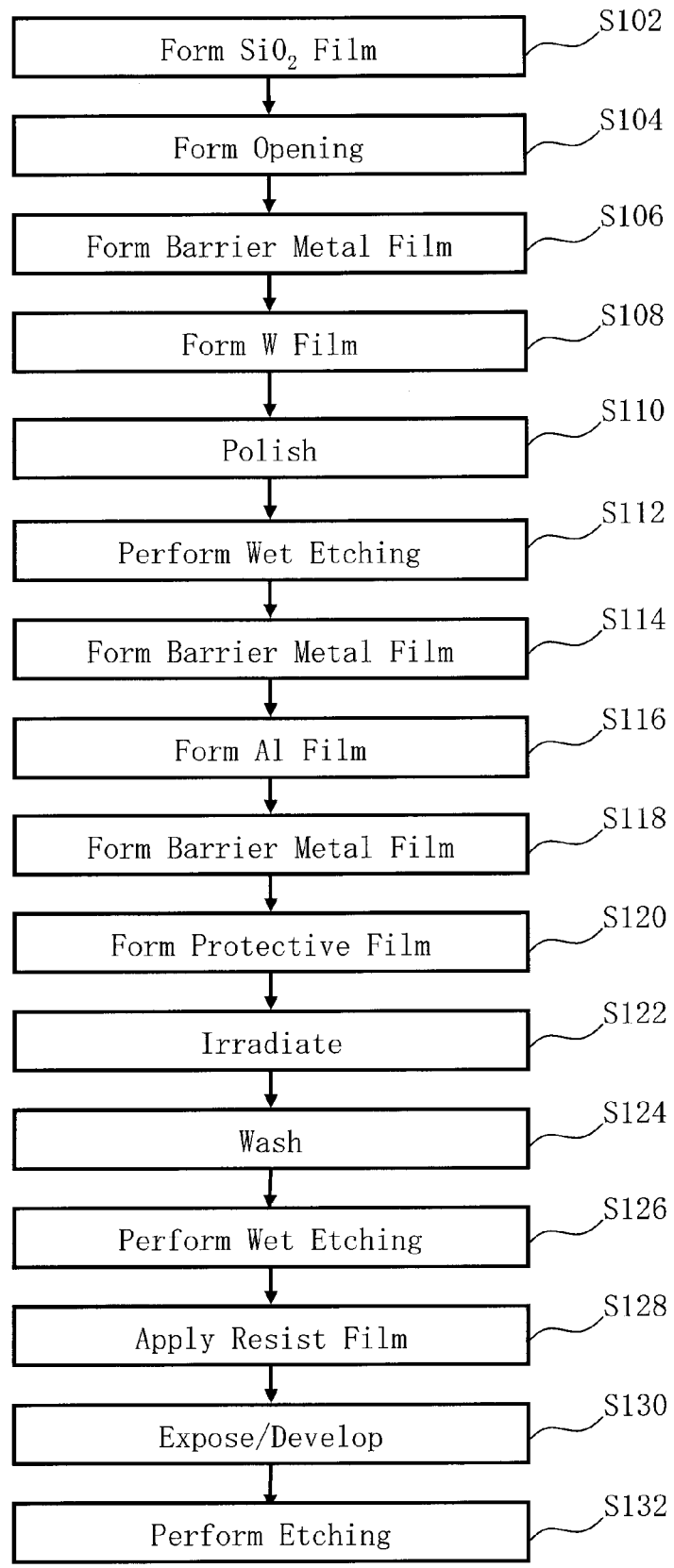
FIG. 12 is a flow chart showing principal parts of a method of manufacturing a semiconductor device in a third embodiment.

FIG. 12 is a flow chart showing principal parts of a method of manufacturing a semiconductor device in the third embodiment. A series of steps shown in FIG. 12 are performed in the third embodiment, including a SiO₂ film formation step (S102) to form a thin film of SiO₂ film, an opening formation step (S104) to form an opening, a barrier metal film formation step (S 106), a W film formation step (S108) to form a thin film of a tungsten (W) film, a polishing step (S110), a wet etching step (S112), a barrier metal film formation step (S114), an Al film formation step (S116) to form a thin film of an aluminum (Al) film, a barrier metal film formation step (S118), a protective film formation step (S120) to form a protective film, an irradiation step (S122), a washing step (S124), a wet etching step (S126), a resist film application step (S128), an exposure/development step (S130), and an etching step (S132). The method of manufacturing a semiconductor device in the third embodiment is the same as that in the first embodiment except that the wet etching step (S112) has been added.

Since the SiO₂ film formation step (S102) to the polishing step (S110) are the same as those in the first embodiment, descriptions thereof are omitted.

FIGS. 13A to 13D are step sectional views representing steps performed corresponding to the flow chart in FIG. 12. FIGS. 13A to 13D show the wet etching step (S112) to the barrier metal film formation step (S118) in FIG. 12. The subsequent steps will be described later.

In FIG. 13A, as the wet etching step to be an example of etching step, the alignment mark 300 and the W plug 310 are planarized by CMP to form an embedded structure, and then, a recess 344 is formed by digging down to a depth t5 by wet etching or dry etching of the SiO₂ film 210, which is a dielectric film in the field. The depth t5 of the recess 344 is desirably 10 nm or more, for example. Also, the depth t5 of the recess 344 can be processed to an extent that the alignment mark 300 or the W plug 310 does not fall by digging down too much.

Then, as shown in FIG. 13B, the barrier metal film 240 is formed on the surface of the W film 216 and the TiN film 214 protruding upward in a convex fashion from the surface of the SiO₂ film 210. Then, as shown in FIG. 13C, the Al film 260 (an example of the second film) to be upper-layer wiring of the W plug 310 is formed on the barrier metal film 240 and, as shown in FIG. 13D, the barrier metal film 242 is formed on the surface of the Al film 260.

Figure 14A:
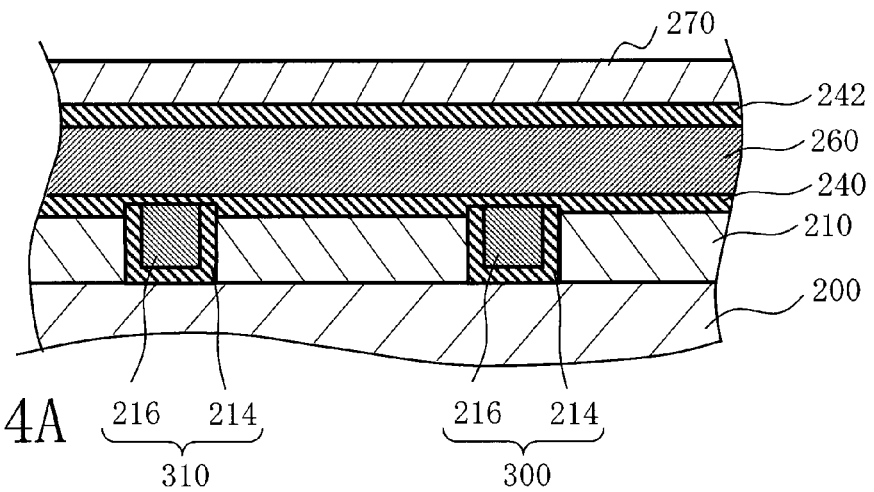
FIGS. 14A to 14C are step sectional views representing steps performed corresponding to the flow chart in FIG. 12.
Figure 14B:
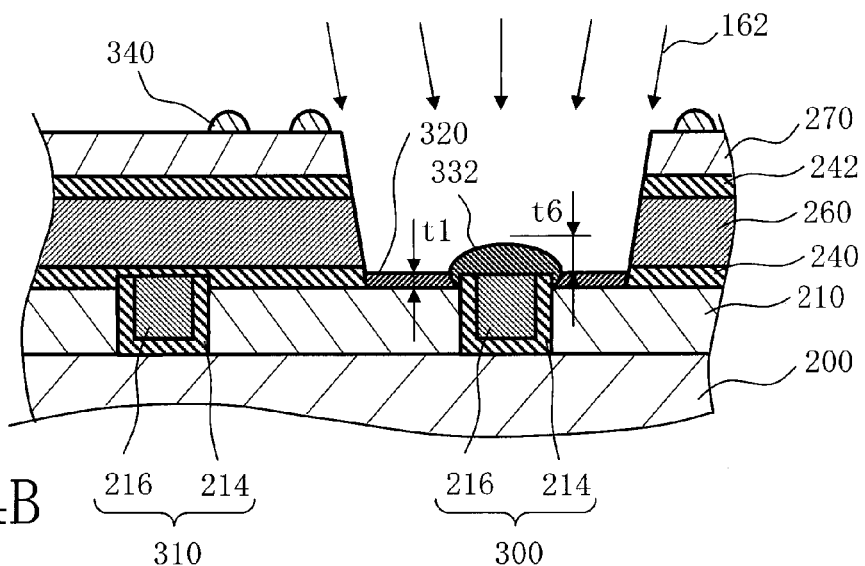
Figure 14C:
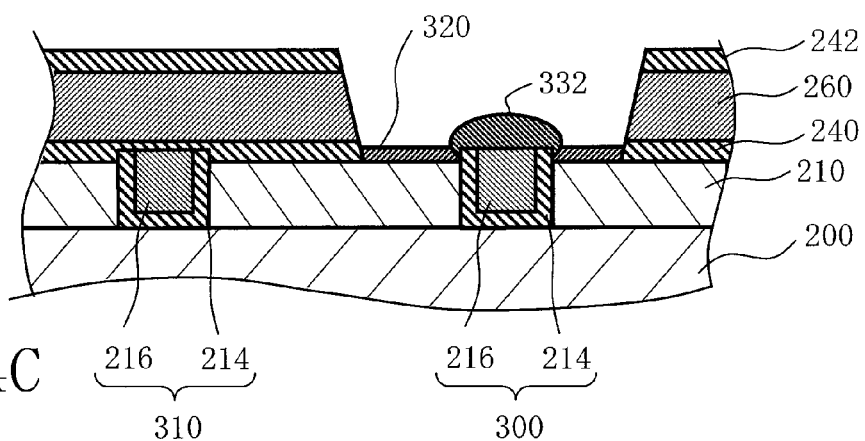

FIGS. 14A to 14C are step sectional views representing steps performed corresponding to the flow chart in FIG. 12. FIGS. 14A to 14C show the protective film formation step (S120) to the washing step (S124) in FIG. 12. The subsequent steps will be described later.

In FIG. 14A, as the protective film formation step, the aqueous protective film 270 is formed on the surface of the barrier metal film 242. The barrier metal film formation step (S114) to the protective film formation step (S120) described above are the same as those in the first embodiment except that the W film 216 and the TiN film 214 protrude upward in a convex fashion from the surface of the SiO₂ film 210.

In FIG. 14B, as the irradiation step to be an example of removal step, the laminated film containing Al is removed by irradiating a region including the alignment mark 300 with the processing light 162 using ablation technology. Then, the laminated film of the Al film 260 and the barrier metal films 240 and 242 is removed to such an extent that the residual film 320, which is a portion of the Al film 260 and the barrier metal films 240 and 242, remains. At this point, since the W film 216 and the TiN film 214 protrude upward in a convex fashion from the surface of the SiO₂ film 210, a large amount of Al and Ti remains on W in the spherical shape and further the position of the residue can be aligned on W below. This is because Al and Ti, which are materials to be ablated, tend to remain on W, which acts as a heat sink. Thus, compared with a case in which ablation is performed in a state that the W film 216 and the TiN film 214 are as high as the surface of the SiO₂ film 210 and do not protrude upward like the first and second embodiments, the center position of a spherical residual film 322 can be brought closer to that of the alignment mark 300. Since the amounts of Al and Ti remaining on W in the spherical shape increase, a thickness t6 of the residual film 322 can also be increased. Otherwise, the irradiation step is the same as that in the first embodiment.

Then, as the washing step shown in FIG. 14C, the debris 340 outside the irradiation region is removed together with the aqueous protective film 270 by washing.

Figure 15A:
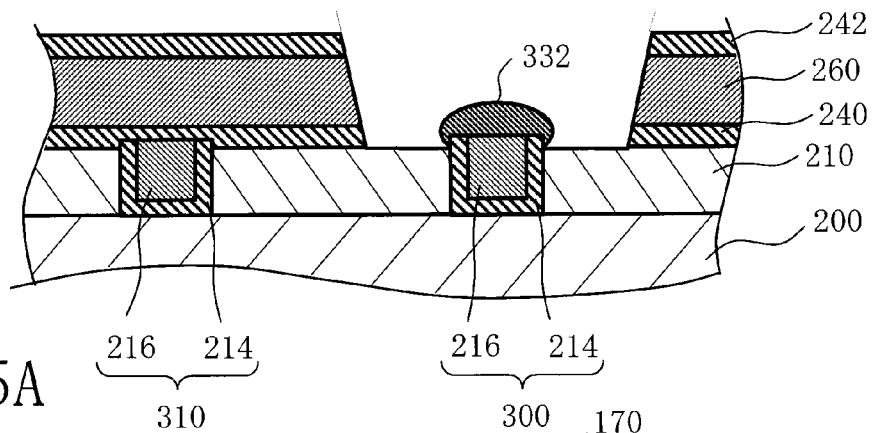
FIGS. 15A to 15C are step sectional views representing steps performed corresponding to the flow chart in FIG. 12.
Figure 15B:
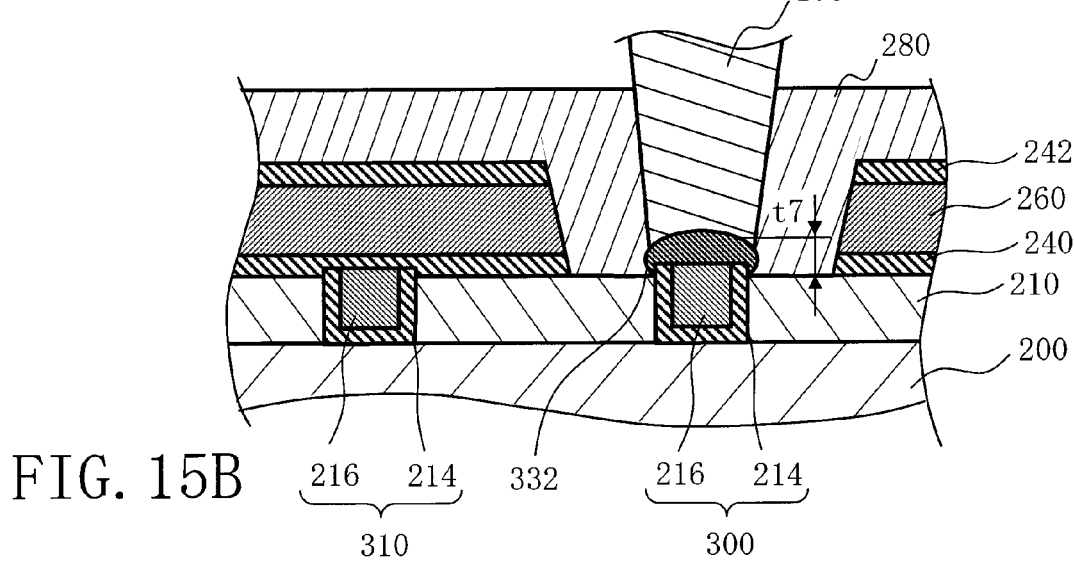
Figure 15C:
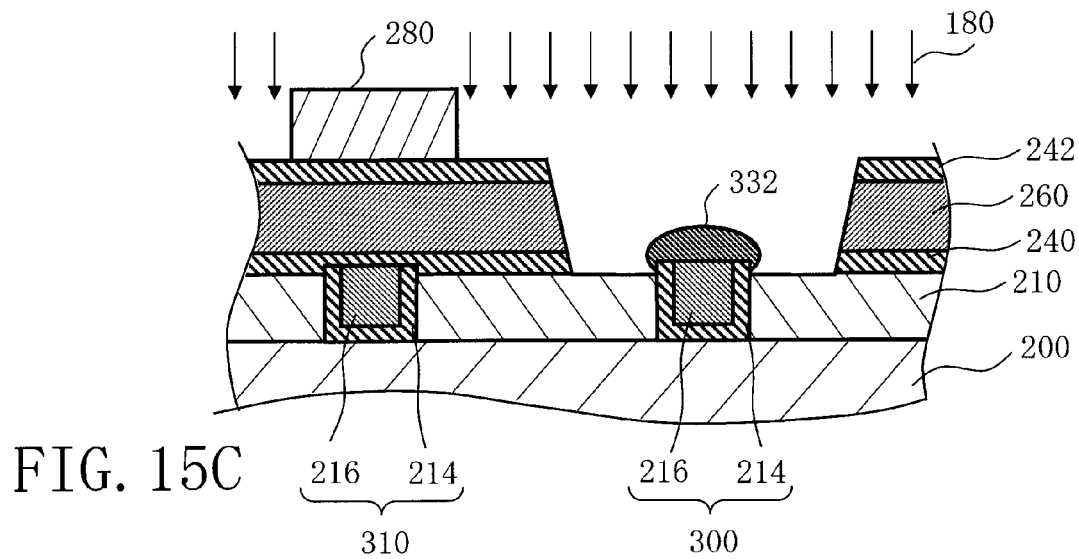

FIGS. 15A to 15C are step sectional views representing steps performed corresponding to the flow chart in FIG. 12. FIGS. 15A to 15C show the wet etching step (S126) to the exposure/development step (S130) in FIG. 12. The subsequent steps will be described later.

In FIG. 15A, as the wet etching step to be an example of etching step, the residual film 320 is etched by exposing the residual film 320 remaining in the irradiation region 302 to an etching environment for etching residues of the laminated film including the Al film 260. Here, when removing the laminated film including the Al film 260 by irradiation of the processing light 162, the laminated film is removed in such a way that the thickness t1 of the residual film 320 left in the rest irradiation region 302 becomes thinner than the thickness t6 of the residual film 332 remaining on the alignment mark 300.

Therefore, the residual film 320 on the SiO₂ film 210 can be removed by etching while leaving the residual film 332 on W.

In FIG. 15B, as the resist application step, a resist is applied to the substrate surface to form the resist film 280. Then, the position of the alignment mark 300 of W is optically detected by the alignment light 170 to perform alignment for patterning of Al wiring to be an upper layer of the W plug 310 by use of the detected position of the alignment mark 300 as an index mark. Here, since a protruding height t7 of the residual film 332 from the surface of the SiO₂ film 210 can be taken higher in the third embodiment than other embodiments, signal strength can still be increased. Thus, signal detection during detection can be made easier. Further, since the center position of the spherical residual film 332 is closer to that of the alignment mark 300, the position precision is high and thus lithography can be performed with high precision.

Then, as shown in FIG. 15C, a resist pattern is formed by selectively irradiating the resist film 280 with the exposure light 180 to perform development processing.

Figure 16:
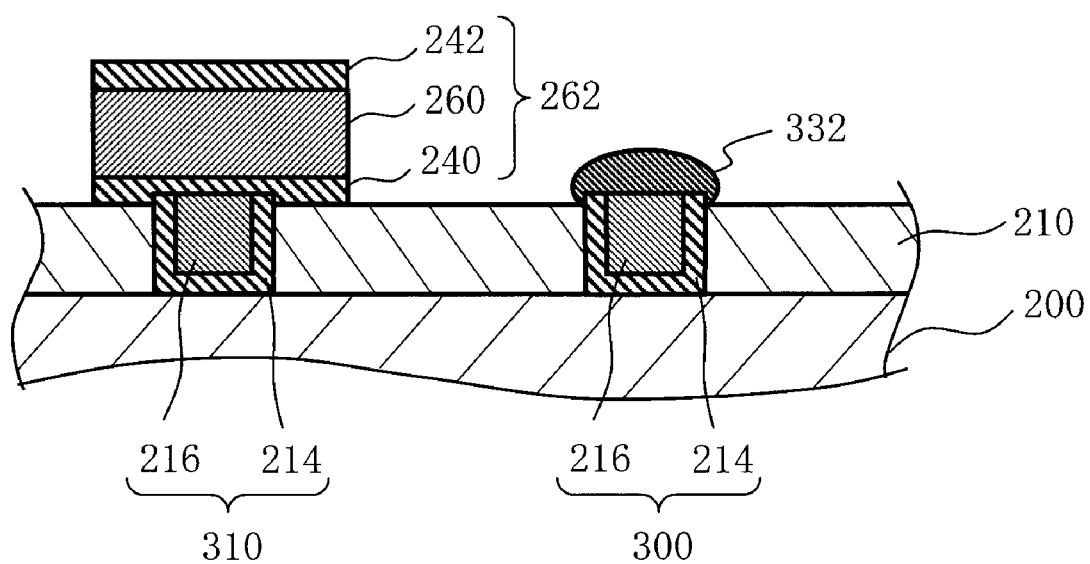
FIG. 16 is a step sectional view representing a process performed corresponding to the flow chart in FIG. 12.

FIG. 16 is a step sectional view representing a step performed corresponding to the flow chart in FIG. 12. FIG. 16 shows the etching step (S132) in FIG. 12.

As the etching step shown in FIG. 16, the wiring 262 of Al is formed by selectively etching the laminated film including the Al film 260 using the resist pattern formed by the above lithography process as a mask. Subsequently, processing such as ashing is performed to remove the resist pattern. The exposure/development step (S114) to the etching step (S132) described above are the same as those in the first embodiment except that the W film 216 and the TiN film 214 protrude upward in a convex fashion from the surface of the SiO₂ film 210 and the spherical residual film 332 is larger and formed at a still more precise position.

Table 1 shows an example of deviation measurement results of alignment in the first and third embodiments.

TABLE 1

|  | X(nm) | Y(nm) |
| --- | --- | --- |
| Related Art | 35 | 40 |
| Embodiment 1 | 25 | 23 |
| Embodiment 3 | 12 | 15 |

As shown in Table 1, alignment using the structure obtained in the first embodiment causes a smaller deviation than a prior art in which a whole laminated film including the Al film 260 is removed by ablation. Further, a still smaller deviation is caused by performing alignment using the structure obtained in the third embodiment in which the spherical residual film 332 arranged on the W film 216 protrudes upward in a convex fashion from the surface of the SiO₂ film 210 and positional precision of the residual film 332 is improved.

Here, in each embodiment, Al and Ti are used as materials to be ablated, but the present invention is not limited to this and any material whose melting point is lower than that of the alignment mark material may be used as a material to be ablated. For example, in addition to Al and TiN, a material selected from at least one of Ti, copper (Cu), Ta, or a nitride film or oxide film of these elements may be used.

The embodiments have been described above with reference to concrete examples. However, the present invention is not limited to these concrete examples.

Further, the thickness of inter-layer dielectric film, the size, form, and number of openings and the like that are needed by semiconductor integrated circuits, and various semiconductor elements can appropriately be selected for use.

Moreover, all methods for fabricating, or "manufacturing" a semiconductor device that are equipped with elements of the present invention and whose design can suitably be modified by a person skilled in the art are included in the scope of the present invention.

Though techniques usually used in semiconductor industry, for example, photolithography processes and cleaning after processing are omitted for simplification of a description, these techniques are naturally included in the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for fabricating a semiconductor device, comprising:
   forming a plurality of openings in a first film;
   embedding a metallic material serving as both a plug material and an alignment mark material for alignment with an upper layer in the plurality of openings;
   forming a second film on the first film in which the metallic material is embedded;
   irradiating the second film formed in a predetermined region including a position where the metallic material is embedded as the alignment mark material with a processing light, thereby to remove the second film to an extent that a portion of the second film remains in the predetermined region; and
   etching, by wet etching method, the portion of the second film remaining in the predetermined region and not having been removed by controlling that the portion of the second film remains in the predetermined region in the irradiating.

2. The method according to claim 1, wherein, when removing the second film by irradiation of the processing light, the second film is removed in such a way that a thickness of a residue of the second film remaining in the predetermined region outside the alignment mark material becomes thinner than the thickness of any residue of the second film remaining on the alignment mark material.

3. The method according to claim 2, wherein, when removing the second film by irradiation of the processing light, the second film is removed in such a way that the thickness of the residue of the second film remaining in the predetermined region outside the alignment mark material is 10 nm or less.

4. The method according to claim 1, wherein a material whose melting point is higher than that of a material of the second film is used as the metallic material.

5. The method according to claim 1, wherein the processing light in a substantial top hat waveform is applied.

6. The method according to claim 1, wherein, when etching the second film, a surface of the first film is etched in such a way that an upper part of the alignment mark material protrudes in the predetermined region.

7. The method according to claim 1, further comprising forming an aqueous protective film on the second film before irradiation of the processing light.

8. The method according to claim 1, further comprising etching a surface of the first film in such a way that an upper part of the alignment mark material protrudes, after the alignment mark material is embedded in the openings and before the second film is formed.

9. The method according to claim 1, further comprising:
forming a resist film above the second film and the predetermined region after etching the portion of the second film;
exposing a predetermined pattern to the resist film after performing alignment using the alignment mark material as an index mark; and
etching the second film using as a mask the resist pattern formed based on the exposure, thereby to form wiring for connection to the metallic material embedded as the plug material.

10. A method for fabricating a semiconductor device, comprising:
forming an opening in a first film;
embedding an alignment mark material for alignment with an upper layer in the opening;
forming a second film on the first film in which the alignment mark material is embedded;
irradiating the second film formed in a predetermined region including a position where the alignment mark material is embedded with a processing light, thereby to remove the second film to an extent that a portion of the second film remains in the predetermined region; and
exposing the portion of the second film remaining in the predetermined region to an etching environment for etching, by wet etching method, the portion of the second film which has not been removed by controlling that the portion of the second film remains in the predetermined region in the irradiating.

11. The method according to claim 10, wherein, when removing the second film by irradiation of the processing light, the second film is removed in such a way that a thickness of a residue of the second film remaining in the predetermined region outside the alignment mark material becomes thinner than the thickness of a residue of the second film remaining on the alignment mark material.

12. The method according to claim 11, wherein, when removing the second film by irradiation of the processing light, the second film is removed in such a way that the thickness of the residue of the second film remaining in the predetermined region outside the alignment mark material is 10 nm or less.

13. The method according to claim 10, wherein a material whose melting point is higher than that of a material of the second film is used as the alignment mark material.

14. The method according to claim 10, wherein, when etching the second film, a surface of the first film is etched in such a way that an upper part of the alignment mark material protrudes in the predetermined region.

15. The method according to claim 14, wherein, when etching the surface of the first film, an etchant containing fluoric acid is used.

16. The method according to claim 10, wherein a laminated film of a metal film to be a wiring material is used as the second film.

17. The method according to claim 10, further comprising forming an aqueous protective film on the second film before irradiation of the processing light.

18. The method according to claim 17, further comprising washing the aqueous protective film after irradiation of the processing light.

19. The method according to claim 10, wherein, when exposing the portion of the second film to the etching environment, the portion of the second film is brought into contact with an etchant containing organic acid.

20. The method according to claim 10, further comprising etching a surface of the first film in such a way that an upper part of the alignment mark material protrudes, after the alignment mark material is embedded in the opening and before the second film is formed.

* * * * *